(12) United States Patent
Li

(10) Patent No.: US 11,360,150 B2
(45) Date of Patent: Jun. 14, 2022

(54) FAULT DETECTION FOR BATTERY MANAGEMENT SYSTEMS

(71) Applicant: O2 Micro, Inc., Santa Clara, CA (US)

(72) Inventor: Guoxing Li, Sunnyvale, CA (US)

(73) Assignee: O2Micro Inc., Santa Clara, CA (US)

( * ) Notice: Subject to any disclaimer, the term of this patent is extended or adjusted under 35 U.S.C. 154(b) by 0 days.

(21) Appl. No.: 17/229,640

(22) Filed: Apr. 13, 2021

(65) Prior Publication Data

US 2021/0231738 A1 Jul. 29, 2021

Related U.S. Application Data

(63) Continuation of application No. 16/058,218, filed on Aug. 8, 2018, now Pat. No. 11,009,553.

(30) Foreign Application Priority Data

Aug. 18, 2017 (GB) ..................... 1713274

(51) Int. Cl.
| | | |
|---|---|---|
| *G01R 31/371* | (2019.01) | |
| *H01M 10/48* | (2006.01) | |
| *G01R 31/396* | (2019.01) | |
| *H02J 7/00* | (2006.01) | |
| *H01M 10/42* | (2006.01) | |

(52) U.S. Cl.
CPC ......... *G01R 31/371* (2019.01); *G01R 31/396* (2019.01); *H01M 10/482* (2013.01); *H01M 10/486* (2013.01); *H02J 7/0021* (2013.01); *H02J 7/0047* (2013.01); *H01M 2010/4271* (2013.01)

(58) Field of Classification Search
CPC . G01R 31/36–396; G01R 31/382–3842; H02J 7/0013; H02J 7/0021; H01M 10/48–488
See application file for complete search history.

(56) References Cited

U.S. PATENT DOCUMENTS

| | | |
|---|---|---|
| 8,390,296 B2 | 3/2013 | Jung et al. |
| 8,517,738 B2 | 8/2013 | Sheehan et al. |
| 8,922,218 B2 | 12/2014 | Li |

(Continued)

FOREIGN PATENT DOCUMENTS

| | | |
|---|---|---|
| CN | 102341715 A | 2/2012 |
| CN | 103090983 A | 5/2013 |

(Continued)

*Primary Examiner* — Huy Q Phan
*Assistant Examiner* — David B Frederiksen

(57) ABSTRACT

A battery management system includes multiple sensors, status detection circuitry, and fault detection circuitry. The sensors sense statuses of a battery pack. The status detection circuitry detects whether the battery pack is in a normal condition based on the statuses to generate a detection result. The fault detection circuitry detects whether a fault is present in the battery pack. The sensors include a current sensor that senses a battery current of the battery pack. The fault detection circuitry includes a detection circuit that monitors a rate of change of a voltage at a terminal of the battery pack, and detects whether a fault is present in the current sensor based on a result of a comparison between the rate of change and a threshold and based on the detection result.

20 Claims, 9 Drawing Sheets

(56) References Cited

U.S. PATENT DOCUMENTS

| | | | |
|---|---|---|---|
| 11,009,553 B2 | 5/2021 | Li | |
| 2007/0236181 A1* | 10/2007 | Palladino | H01M 10/482 320/130 |
| 2010/0188050 A1* | 7/2010 | Asakura | H01M 10/48 320/136 |
| 2012/0004873 A1 | 1/2012 | Li | |
| 2012/0112685 A1 | 5/2012 | Hartley et al. | |
| 2013/0108904 A1 | 5/2013 | Okabayashi | |
| 2013/0271146 A1 | 10/2013 | Sakabe et al. | |
| 2013/0278221 A1 | 10/2013 | Maeda | |
| 2014/0247018 A1 | 9/2014 | Kikuchi et al. | |
| 2014/0347769 A1 | 11/2014 | Kanda et al. | |
| 2014/0354240 A1 | 12/2014 | Wang et al. | |
| 2015/0192630 A1 | 7/2015 | Tsukamoto et al. | |
| 2016/0231382 A1* | 8/2016 | Hirose | H02J 7/00308 |
| 2017/0117532 A1 | 4/2017 | Frias et al. | |
| 2017/0184680 A1 | 6/2017 | You et al. | |
| 2017/0197508 A1 | 7/2017 | Kobayashi | |
| 2017/0259687 A1 | 9/2017 | Chikkannanavar et al. | |
| 2018/0136283 A1 | 5/2018 | Song et al. | |

FOREIGN PATENT DOCUMENTS

| | | |
|---|---|---|
| CN | 103185866 A | 7/2013 |
| CN | 103197188 A | 7/2013 |
| CN | 106501711 A | 3/2017 |
| JP | H06284594 A | 10/1994 |
| JP | 2000206221 A | 7/2000 |

\* cited by examiner

FAULT DETECTION FOR BATTERY MANAGEMENT SYSTEMS

RELATED APPLICATION

This application is a Continuation Application of the co-pending commonly-owned U.S. Patent Application with Ser. No. 16/058,218, filed on Aug. 8, 2018, which claims benefit under 35 U.S.C. § 119(a) to Application No. 1713274.7, now Patent No. 2551081, filed with the United Kingdom Intellectual Property Office on Aug. 18, 2017, hereby incorporated herein by reference in its entirety.

BACKGROUND

FIG. 1 illustrates a circuit diagram of a conventional battery pack 100. The battery pack 100 includes battery cells 102, a battery management system (hereinafter, BMS) 104, and sensors such as a sense resistor $R_{SEN}$ and a thermistor $R_{THM}$. The sense resistor $R_{SEN}$ generates a sense voltage $V_{SEN}$ indicative of a current flowing through the battery cells 102. The thermistor $R_{THM}$ generates an indication voltage $V_{THM}$ indicative of the temperature in the battery pack 100. The BMS 104 protects the battery pack 100 from, e.g., an over-current condition, an over-temperature condition, an under-temperature condition, etc., based on the sensed information, e.g., $V_{SEN}$ and VTHM, from the sensors. However, if the sensors and the BMS 104 are not well connected or if the sensors are broken, then the BMS 104 cannot receive correct information from the sensors, and this may place the battery pack 100 and/or a system load powered by the battery pack 100 at a high risk of being damaged.

Additionally, the BMS 104 includes a voltage regulator (not shown) that generates a regulated output to power internal function blocks and/or peripherals such as a microcontroller unit (MCU), an LED (light-emitting diode) display, LDO (low dropout) regulator, etc. If a fault (e.g., a short circuit) is present in the components powered by the voltage regulator, it can draw excessive current from the voltage regulator and generate heat to damage the BMS 104 and/or the battery pack 100.

SUMMARY

Embodiments according to the present invention detect faults in the status sensors and battery management system of a battery pack.

In embodiments, a battery management system includes multiple sensors, status detection circuitry, and fault detection circuitry. The sensors sense statuses of a battery pack. The status detection circuitry detects whether the battery pack is in a normal condition based on the statuses to generate a detection result. The fault detection circuitry detects whether a fault is present in the battery pack. The sensors include a current sensor that senses a battery current of the battery pack. The fault detection circuitry includes a detection circuit that monitors a rate of change of a voltage at a terminal of the battery pack, and detects whether a fault is present in the current sensor based on a result of a comparison between the rate of change and a threshold and also based on the detection result.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Embodiments according to the present invention provide solutions to detect faults in battery packs. When a fault in a status sensor or in a battery management system (BMS) in a battery pack is detected, then an action such as fixing the fault, replacing the defective sensor with a new sensor, replacing the defective BMS with a new BMS, replacing the defective battery pack with a new battery pack, or the like can be taken to protect the battery pack and/or a system load powered by the battery pack. As a result, the risk of the battery pack and/or the system load being damaged can be reduced.

Figure 1:
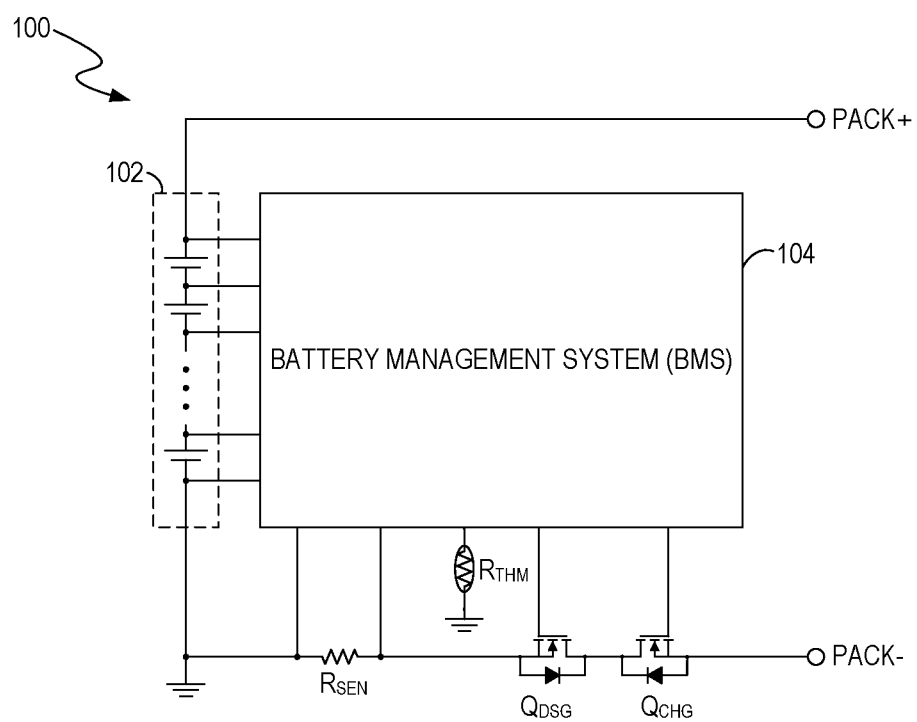
FIG. 1 illustrates a circuit diagram of a conventional battery pack.
Figure 2A:
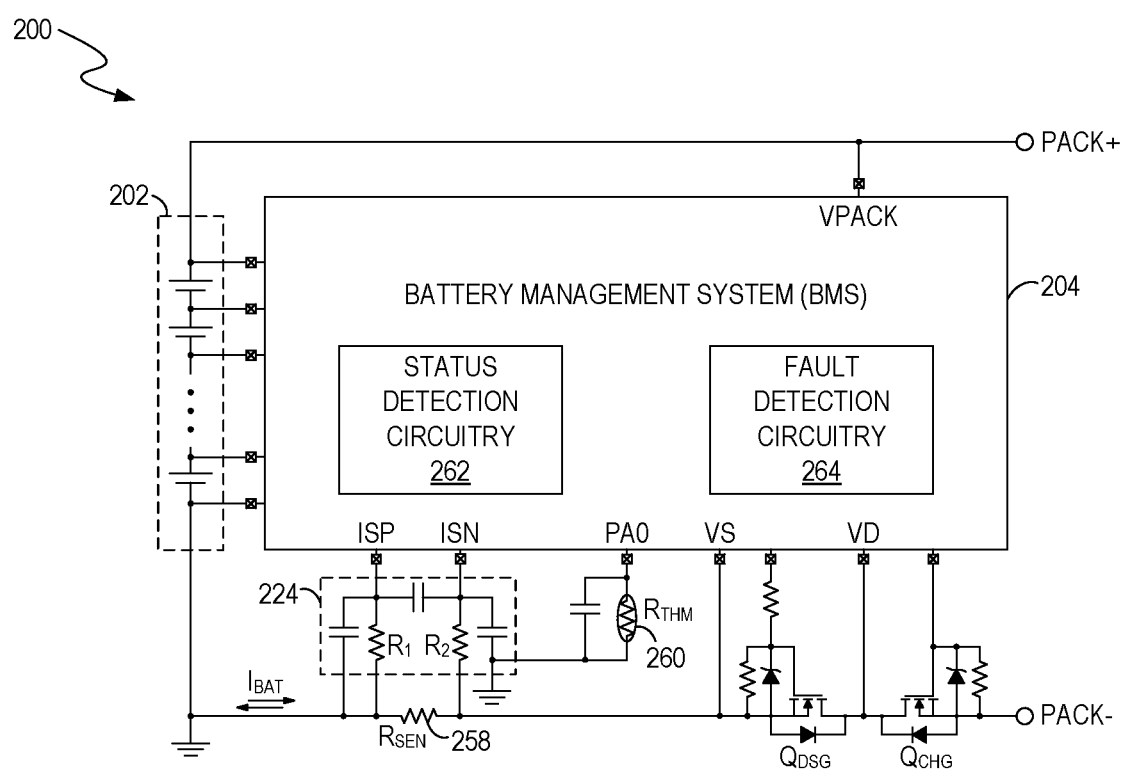
FIG. 2A illustrates a circuit diagram of an example of a battery pack, in an embodiment of the present invention.

FIG. 2A illustrates a circuit diagram of an example of a battery pack 200, in an embodiment of the present invention. As shown in FIG. 2A, the battery pack 200 includes one or more battery cells 202, a battery management system (BMS) 204, and status sensors such as a current sensor 258 and a temperature sensor 260. The status sensors can sense statuses of the battery pack 200. The BMS 204 includes status detection circuitry 262 that detects whether the battery pack 200 is in a normal condition based on the sensed statuses. The BMS 204 also includes fault detection circuitry 264 that detects whether a fault is present in the status sensors.

More specifically, in an embodiment, the current sensor 258, e.g., a sense resistor $R_{SEN}$, senses a battery current $I_{BAT}$ (e.g., a charging current or a discharging current) of the battery cells 202 to generate a sense voltage $V_{SEN}$ indicative of the battery current $I_{BAT}$. The temperature sensor 260, e.g., a thermistor $R_{THM}$, senses temperature in the battery pack 200 to generate an indication voltage $V_{THM}$ indicative of the temperature.

In an embodiment, the BMS 204 can be an integrated circuit (IC) that includes current sensing pins ISP and ISN that receive a sense voltage $V_{SEN}$ from the current sensor 258 through a low-pass filter 224. The status detection circuitry 262 receives the sense voltage $V_{SEN}$ from the current sensing pins ISP and ISN, and determines whether the battery current $I_{BAT}$ is greater than or less than an over-current (OC) threshold according to the sense voltage $V_{SEN}$. If the battery current $I_{BAT}$ is greater than the OC threshold, then the status detection circuitry 262 determines that the battery current $I_{BAT}$ is in an OC condition. If the battery current $I_{BAT}$ is less than the OC threshold, then the status detection circuitry 262 determines that the battery current $I_{BAT}$ is in a normal condition.

Additionally, in an embodiment, the BMS 204 includes a temperature sensing pin PA0 that receives an indication voltage $V_{THM}$ from the temperature sensor 260. The status detection circuitry 262 receives the indication voltage $V_{THM}$ from the temperature sensing pin PA0, and determines a temperature status of the battery pack 200. For example, the temperature sensor 260 includes a thermistor $R_{THM}$ having a negative temperature coefficient, and when a preset constant current flows through the thermistor $R_{THM}$, the indication voltage $V_{THM}$ can decrease if the temperature increases, and increase if the temperature decreases. Thus, if the indication voltage $V_{THM}$ is less than an over-temperature threshold $V_{VOT}$, then the status detection circuitry 262 determines that the battery pack 200 is in an over-temperature condition. If the indication voltage $V_{THM}$ is greater than an under-temperature threshold $V_{UT}$ ($V_{UT}$>$V_{OT}$), then the status detection circuitry 262 determines that the battery pack 200 is in an under-temperature condition. If the indication voltage $V_{THM}$ is greater than the over-temperature threshold $V_{OT}$ and less than the under-temperature threshold $V_{UT}$, then the status detection circuitry 262 determines that the battery pack 200 is in a normal temperature condition.

In an embodiment, the BMS 204 also includes a voltage sense pin $V_{PACK}$ that senses a terminal voltage $V_{PACK}$ at the positive input/output terminal PACK+ of the battery pack 200. Additionally, the BMS 204 may include sensing pins VS and VD that receive a voltage across an $R_{DS(ON)}$ resistance of the discharge switch $Q_{DSG}$ of the battery pack 200. In other words, the sensing pins VS and VD can receive a drain-source voltage $V_{DS}$ of the discharge switch $Q_{DSG}$ when the discharge switch $Q_{DSG}$ (e.g., a metal-oxide-semiconductor field-effect transistor; MOSFET) operates in a linear (ohmic) region, e.g., is fully turned on. The fault detection circuitry 264 can detect whether a fault is present in the status sensors based on the sense voltage $V_{SEN}$, voltages at the pins ISP and ISN, the indication voltage $V_{THM}$, the terminal voltage $V_{PACK}$, and/or the drain-source voltage $V_{DS}$. For example, the fault detection circuitry 264 can detect whether a short circuit is present in the current sensor 258 based on the sense voltage $V_{SEN}$ and a rate of change of the terminal voltage $V_{PACK}$, and/or the drain-source voltage $V_{DS}$. The fault detection circuitry 264 can also detect whether an open circuit is present between the status detection circuitry 262 and the current sensor 258 based on the voltages of the pins ISP and ISN. Moreover, the fault detection circuitry 264 can detect whether a short circuit or an open circuit is present in the temperature sensor 260 based on the indication voltage $V_{THM}$. Detailed explanations for the fault detection are presented as follows.

Figure 2B:
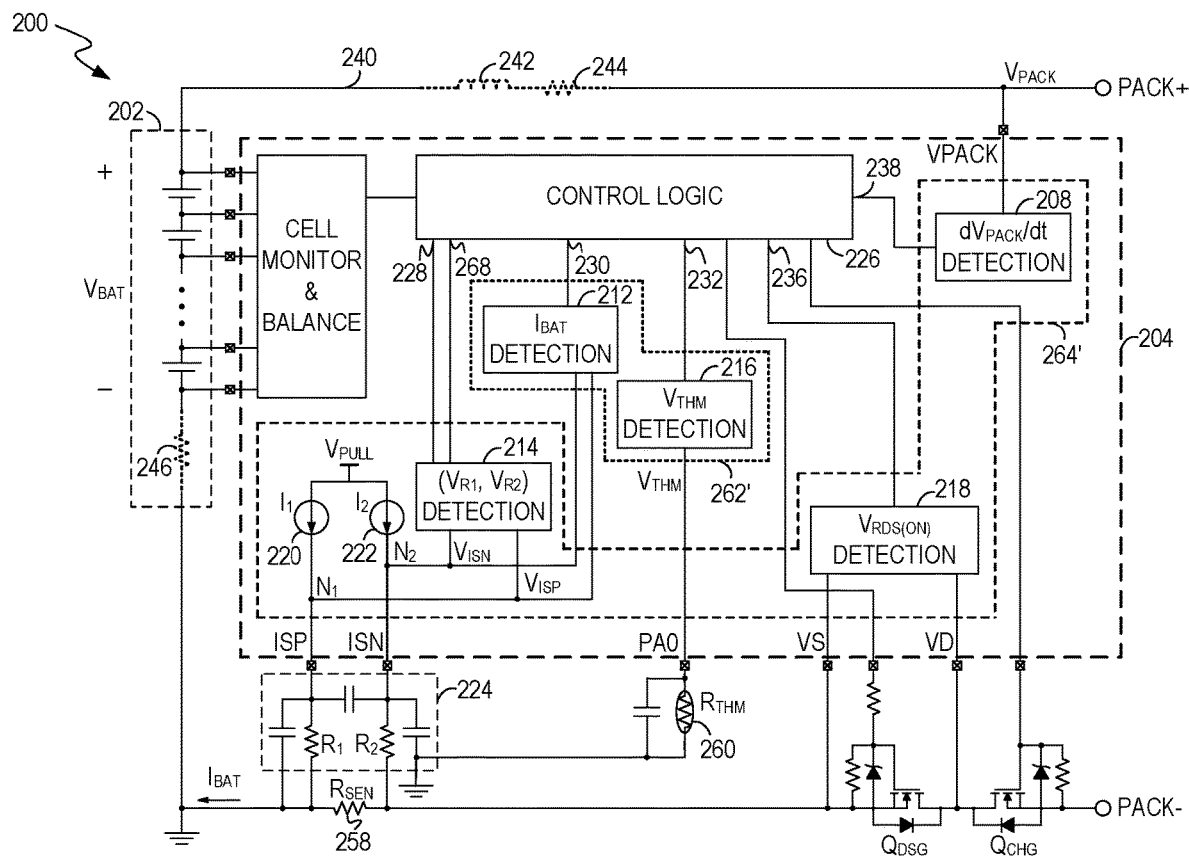
FIG. 2B illustrates a circuit diagram of an example of a battery management system, in an embodiment of the present invention.

FIG. 2B illustrates a circuit diagram of an example of the BMS 204, in an embodiment of the present invention. FIG. 2B is described in combination with FIG. 2A, FIG. 3, FIG. 4, FIG. 5A, FIG. 5B, FIG. 6, FIG. 7, FIG. 8 and FIG. 9. As shown in FIG. 2B, the BMS 204 includes a control logic circuit 226, a status detection circuit 262', and a fault detection circuit 264'. The status detection circuit 262' can include detection circuits 212 and 216. The fault detection circuit 264' can include detection circuits 208, 218 and 214.

In an embodiment, the combined circuit of the $dV_{PACK}/dt$ detection circuit 208 and the control logic circuit 226 can be referred to as a "first detection circuit," and the first detection circuit can detect a short circuit in the current sensor 258. In an embodiment the combined circuit of the $V_{RDS(ON)}$ detection circuit 218 and the control logic circuit 226 can be referred to as a "second detection circuit," and the second detection circuit can detect a short circuit in the current sensor 258. In an embodiment, the combined circuit of the ($V_{R1}$, $V_{R2}$) detection circuit 214, the current generating circuits 220 and 222, and the control logic circuit 226 can be referred to as a "third detection circuit," and the third detection circuit can detect an open circuit at the pins ISP and ISN. In an embodiment, the combined circuit of the $V_{THM}$ detection circuit 216 and the control logic circuit 226 can be referred to as a "fourth detection circuit," and the fourth detection circuit can detect a short circuit and/or an open circuit in the temperature sensor 260.

Figure 4:
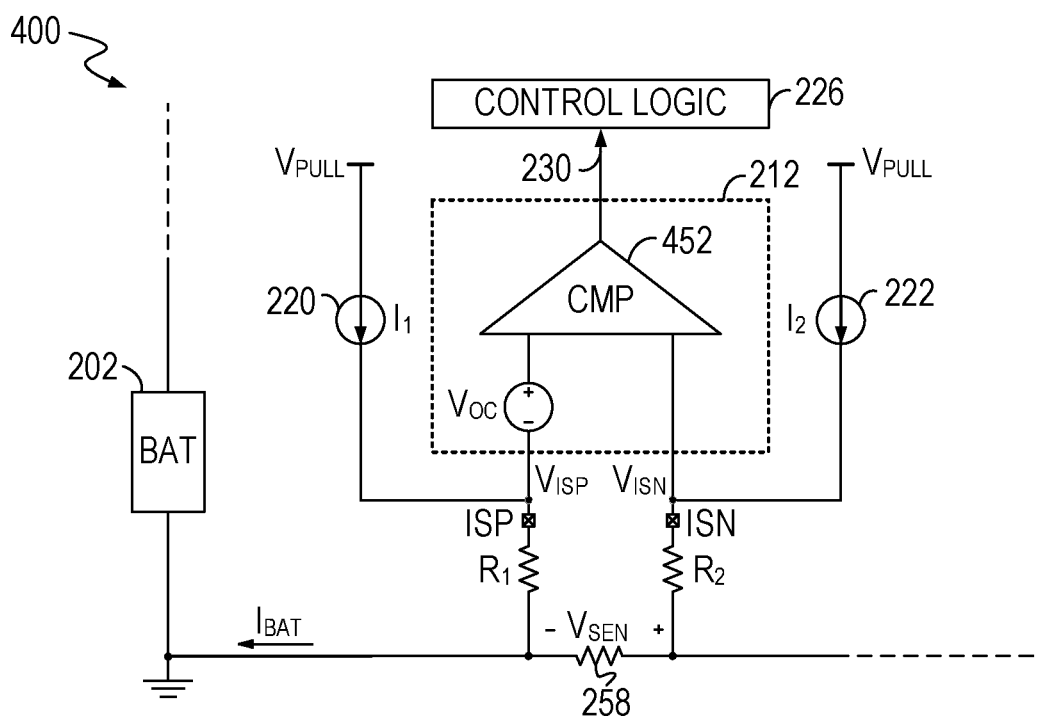
FIG. 4 illustrates a circuit diagram of an example of a detection circuit, in an embodiment of the present invention.

In an embodiment, the status detection circuit 262' and the control logic circuit 226 constitute the status detection circuitry 262 (FIG. 2A) that detects statuses of the battery pack 200 based on information from the status sensors 258 and 260. More specifically, the status detection circuit 262' includes a battery-current ($I_{BAT}$) detection circuit 212. An example of the battery-current detection circuit 212 is illustrated in FIG. 4. For clarity, the filter capacitors in the low-pass filter 224 shown in FIG. 2B are not shown in FIG. 4.

In the example of FIG. 4, the battery-current detection circuit 212 includes a comparator 452 that compares a voltage difference $V_{ISN}$-$V_{ISP}$ between the sensing pins ISN and ISP with a voltage threshold $V_{OC}$ to generate a comparison result 230, e.g., a digital logic signal. In an embodiment, the comparison result 230 can be referred to as a "detection result" of the status detection circuit 262'. The voltage threshold $V_{OC}$ can represent an OC threshold $I_{OC}$ of the battery current $I_{BAT}$. In an embodiment, as shown in FIG. 4, the current generating circuits 220 and 222 generate currents $I_1$ and $I_2$ to flow through the resistors $R_1$ and $R_2$, to maintain the voltages at the sensing pins ISP and ISN at positive voltage levels, e.g., greater than ground voltage. In an embodiment, the resistors $R_1$ and $R_2$ have substantially the same resistance, and the currents $I_1$ and $I_2$ have substantially the same current level. Thus, when the currents $I_1$ and $I_2$ flow through the resistors $R_1$ and $R_2$ respectively, the voltage difference $V_{ISN}$-$V_{ISP}$ between the sensing pins ISN and ISP is substantially equal to the sense voltage $V_{SEN}$ across the current sensor 258, and the comparison result 230 can also represent a result of the comparison between the sense voltage $V_{SEN}$ and the voltage threshold $V_{OC}$. The control logic circuit 226 can determine whether the battery current $I_{BAT}$ is in an OC condition or a normal condition according to the comparison result 230. For example, if the comparison result 230 indicates that the sense voltage $V_{SEN}$ is not greater than the voltage threshold $V_{OC}$, then the control logic circuit 226 can determine that the battery current $I_{BAT}$ is not greater than the OC threshold $I_{OC}$ and is in the normal condition; otherwise, the control logic circuit 226 can determine that the battery current $I_{BAT}$ is greater than the OC threshold $I_{OC}$ and is in the OC condition.

In an embodiment, "the resistors $R_1$ and $R_2$ have substantially the same resistance" mentioned above means a resistance difference between the resistors $R_1$ and $R_2$ is permissible as long as the resistance difference is relatively small and can be neglected. "The currents $I_1$ and $I_2$ . . . have substantially the same current level" mentioned above means a level difference between the currents $I_1$ and $I_2$ is permissible as long as the level difference is relatively small and can be neglected.

Although, in the example of FIG. 4, the battery-current detection circuit 212 includes a comparator 452, the invention is not so limited. In another embodiment, the battery-current detection circuit 212 can include a differential amplifier and an analog-to-digital converter (ADC). The amplifier and ADC can convert the voltage difference $V_{ISN}$-$V_{ISP}$ (or the sense voltage $V_{SEN}$) to a digital signal indicative of the battery current $I_{BAT}$. The control logic circuit 226 can compare the digital signal with a reference (e.g., indicative of the voltage threshold $V_{OC}$) to determine whether the battery current $I_{BAT}$ is in an OC condition or a normal condition.

Returning to FIG. 2B, the status detection circuit 262' can also include a temperature detection circuit 216. The temperature detection circuit 216 can include an ADC that converts an indication voltage $V_{THM}$ on the temperature sensor 260 to a digital signal 232 indicative of the battery temperature. The control logic circuit 226 can compare the digital signal 232 with respective references (e.g., indicative of the over-temperature threshold $V_{OT}$ or under-temperature threshold $V_{UT}$) to determine whether the battery temperature is in a normal-temperature condition, an over-temperature condition, or an under-temperature condition.

In an embodiment, the fault detection circuit 264', the temperature detection circuit 216, and the control logic circuit 226 constitute the fault detection circuitry 264 that detects faults in the status sensors 258 and 260. By way of example, the fault detection circuit 264' can include a rate-of-change ($dV_{PACK}/dt$) detection circuit 208 that monitors a rate of change of a terminal voltage $V_{PACK}$ (e.g., represented by $dV_{PACK}/dt$ or $\Delta V_{PACK}/\Delta t$) at the positive terminal PACK+ of the battery pack 200. The control logic circuit 226 can obtain information 238 for the rate of change $dV_{PACK}/dt$ from the rate-of-change detection circuit 208, and compare the rate of change $dV_{PACK}/dt$ with a predetermined first threshold TH1 (which may also be referred to as a rate of change threshold). Moreover, the control logic circuit 226 can detect whether a fault is present in the current sensor 258 based on a result of a comparison between the rate of change $dV_{PACK}/dt$ and the first threshold TH1 and based on a detection result 230 provided by the battery-current detection circuit 212. In an embodiment, the rate of change $dV_{PACK}/dt$ can have a negative value, and the "the rate of change $dV_{PACK}/dt$" used herein therefore means an absolute value $|dV_{PACK}/dt|$ of the rate of change.

More specifically, in an embodiment, when the battery pack 200 is powering a system load, the battery current $I_{BAT}$ (e.g., a discharging current) can increase if the system load absorbs more power, and can decrease if the system load absorbs less power. If an overload condition occurs in the system load or if a short circuit is present between the terminals PACK+ and PACK− of the battery pack 200, then the battery current $I_{BAT}$ can increase quickly. In an embodiment, the PCB (printed circuit board) trace 240 between the battery cells 202 and the positive terminal PACK+ includes parasitic inductance 242 and parasitic resistance 244. Additionally, the battery cells 202 include internal resistance 246. Thus, if the battery current $I_{BAT}$ flowing through the parasitic inductor 242, the parasitic resistance 244, and the internal resistance 246 increases quickly, it can increase voltage drops across the parasitic inductor 242, the parasitic resistance 244, and the internal resistance 246 quickly, and this can result in decreasing the terminal voltage $V_{PACK}$ at the positive terminal PACK+ quickly. In an embodiment, if a rate of change $dV_{PACK}/dt$ (e.g., a rate of decrease) of the terminal voltage $V_{PACK}$ is greater than the first threshold TH1 for a predetermined time interval $\Delta\Delta t_{PRE}$, it can indicate that the battery current $I_{BAT}$ is in an over-current condition, and the status detection circuitry can detect the over-current condition by receiving a relatively large sense voltage $V_{SEN}$ from the current sensor 258. However, if the current sensor 258 is short-circuited, then the status detection circuitry may receive a relatively small sense voltage $V_{SEN}$ (e.g., zero volts) and determine that the battery current $I_{BAT}$ is in a normal condition. Thus, in an embodiment, if the abovementioned first detection circuit (e.g., including the circuits 208 and 226) detects that the rate of change $dV_{PACK}/dt$ is greater than the first threshold TH1 for a predetermined time interval $\Delta t_{PRE}$, and the status detection circuitry detects that the battery current $I_{BAT}$ is in a normal condition, then the first detection circuit determines that a short circuit is present in the current sensor 258.

Figure 3:
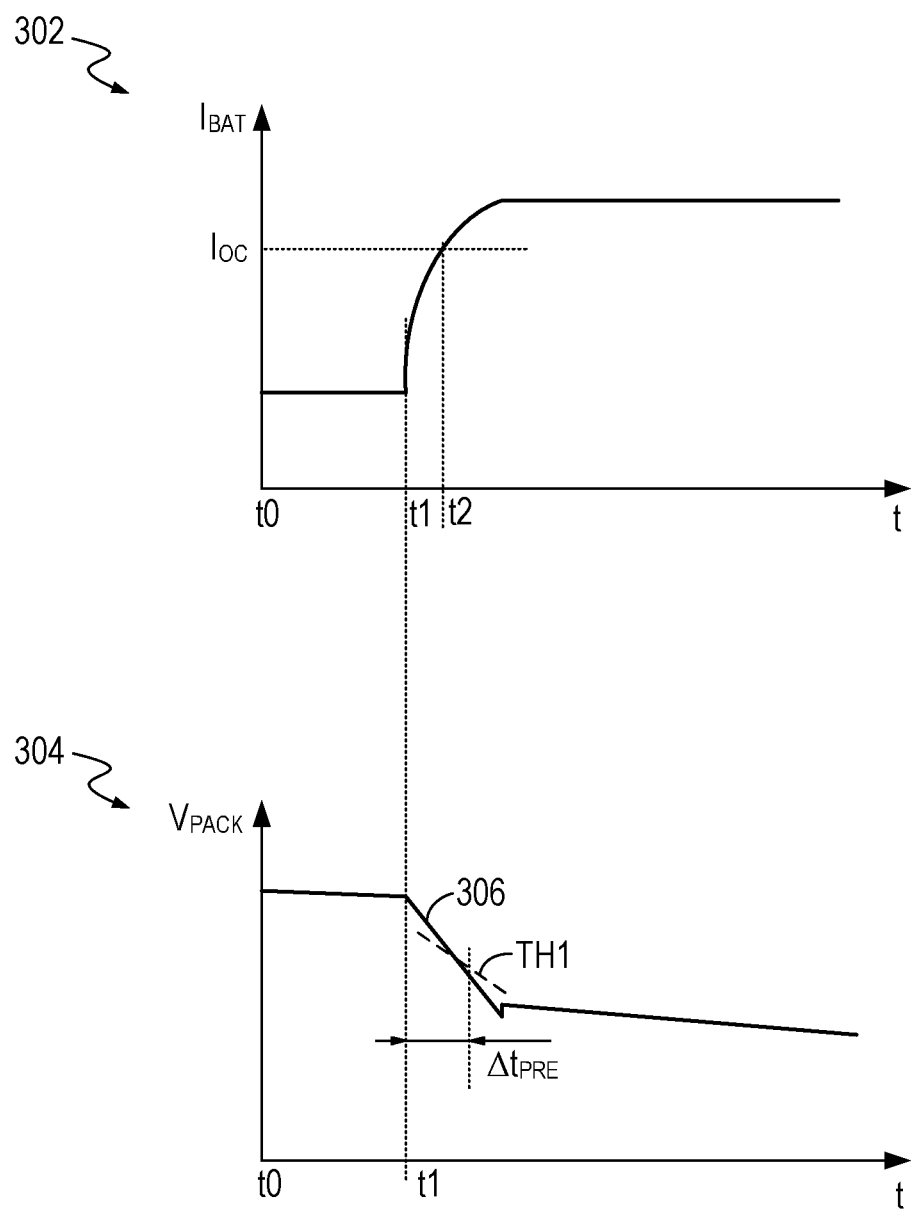
FIG. 3 illustrates examples of signal waveforms for a battery pack, in an embodiment of the present invention.

FIG. 3 illustrates examples of signal waveforms for a battery current $I_{BAT}$ and a terminal voltage $V_{PACK}$ of the battery pack 200, in an embodiment of the present invention. FIG. 3 is described in combination with FIG. 2A and FIG. 2B. As shown in FIG. 3, the waveform 302 represents an example of the battery current $I_{BAT}$, e.g., a discharging current, of the battery pack 200, and the waveform 304 represents an example of the terminal voltage $V_{PACK}$ at the positive terminal PACK+ of the battery pack 200.

In the example of FIG. 3, from time t0 to t1, the discharging current $I_{BAT}$ remains at a relatively stable level, and the terminal voltage $V_{PACK}$ decreases slowly as the voltage $V_{BAT}$ of the battery cells 202 decreases. At time t1, the discharging current $I_{BAT}$ increases quickly (e.g., because of an overload condition or a short circuit between terminals PACK+ and PACK−) and increases to greater than an OC threshold $I_{CC}$, e.g., at time t2. Accordingly, the terminal voltage $V_{PACK}$ (e.g., represented by the solid line 306 in waveform 304) decreases at a rate greater than the first threshold TH1 (e.g., represented by the dashed line TH1 in waveform 304), and this situation can last for at least a predetermined time interval $\Delta t_{PRE}$.

Returning to FIG. 2B, the battery pack 200 includes a discharge switch $Q_{DSG}$ that the battery current $I_{BAT}$ can flow through. When the discharge switch $Q_{DSG}$ (e.g., a MOSFET) operates in a linear (ohmic) region, e.g., is fully turned on, the discharge switch $Q_{DSG}$ has an $R_{DS(ON)}$ resistance, and a sense voltage $V_{RDS(ON)}$ across the $R_{DS(ON)}$ resistance (e.g., a drain-source voltage $V_{DS}$) can represent the battery current $I_{BAT}$. In an embodiment, if the sense voltage $V_{RDS(ON)}$ is greater than a predetermined second threshold TH2 (which may also be referred to as a sense voltage threshold) for a preset time interval, it indicates that the battery current $I_{BAT}$ is in an OC condition. Thus, the second detection circuit (e.g., including the $V_{RDS(ON)}$ detection circuit 218 and the control logic circuit 226) can monitor the sense voltage $V_{RDS(OS)}$ across the discharge switch $Q_{DSG}$, and can detect whether a fault (e.g., a short circuit) is present in the current sensor 258 based on a result of the comparison between the sense voltage $V_{RDS(OS)}$ and the second threshold TH2, and also based on a result of the detection performed by the status detection circuitry 262. By way of example, if the second detection circuit detects that the sense voltage $V_{RDS(ON)}$ is greater than the second threshold TH2 for a preset time interval, and the status detection circuitry 262 detects that the battery current $I_{BAT}$ is in a normal condition, e.g., the status detection circuitry receives a relatively small sense voltage $V_{SEN}$ (e.g., zero volts) from the current sensor 258, then the second detection circuit determines that a short circuit is present in the current sensor 258.

Figure 5A:
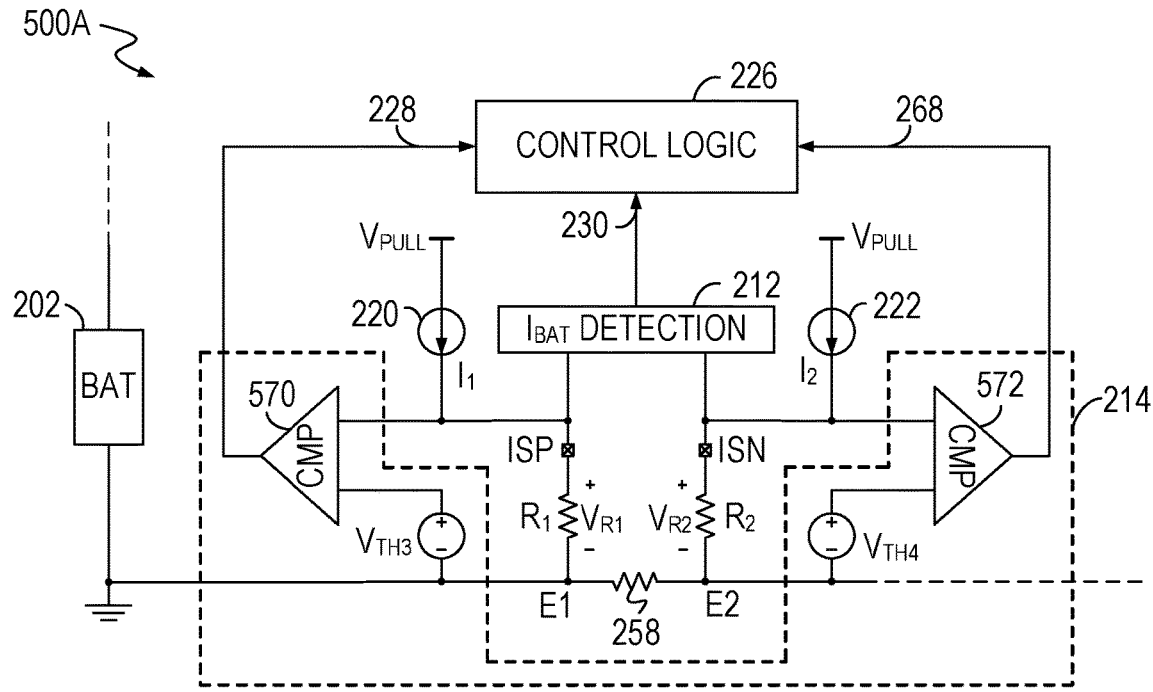
FIG. 5A illustrates a circuit diagram of an example of a detection circuit, in an embodiment of the present invention.

FIG. 5A illustrates a circuit diagram of an example of the abovementioned third detection circuit 500A, in an embodiment of the present invention. As shown in FIG. 5A, the third detection circuit 500A includes the ($V_{R1}$, $V_{R2}$) detection circuit 214, current generating circuits 220 and 222, and the control logic circuit 226. FIG. 5A is described in combination with FIG. 2A, FIG. 2B and FIG. 4.

As shown in FIG. 5A, a first resistor $R_1$ (e.g., a resistor in the low-pass filter 224 in FIG. 2B) is coupled between a first end E1 of the current sensor 258 and a first terminal ISP of the status detection circuitry, and a second resistor $R_2$ (e.g., a resistor in the low-pass filter 224 in FIG. 2B) is coupled between a second end E2 of the current sensor 258 and a second terminal ISN of the status detection circuitry. The current generating circuit 220 generates a first current $I_1$ through the first resistor $R_1$ from the first terminal ISP to the first end E1, and the current generating circuit 222 generates a second current $I_2$ through the second resistor $R_2$ from the second terminal ISN to the second end E2. In an embodiment, the resistances $R_1$ and $R_2$ can be relatively small, and the currents $I_1$ and $I_2$ can also be relatively small. Thus, if the first terminal ISP is well-connected to the first end E1 through the first resistor $R_1$, then a voltage $V_{R1}$ on the first resistor $R_1$ can be relatively small (e.g., less than a third threshold TH3, which may also be referred to as a first voltage threshold). Similarly, if the second terminal ISN is well-connected to the second end E2 through the second resistor $R_2$, then a voltage $V_{R2}$ on the second resistor $R_2$ can be relatively small (e.g., less than a fourth threshold TH4, which may also be referred to as a second voltage threshold). However, if an open circuit is present at the first terminal ISP (e.g., the status detection circuitry has a loose connection with the first end E1 of the current sensor 258), then a voltage $V_{ISP}$ at the first terminal ISP can be pulled up by the power supply $V_{PULL}$, e.g., $V_{ISP}=V_{PULL}$. As a result, the voltage $V_{R1}$ on the first resistor $R_1$ can increase to greater than the third threshold TH3. Similarly, if an open circuit is present at the second terminal ISN, then the voltage $V_{R2}$ on the second resistor $R_2$ can increase to greater than the fourth threshold TH4.

Accordingly, the third detection circuit can detect whether a fault (e.g., an open circuit) is present at the first and second terminals ISP and ISN by comparing a voltage $V_{R1}$ on the first resistor $R_1$ with the predetermined third threshold TH3 and by comparing a voltage $V_{R2}$ on the second resistor $R_2$ with the predetermined fourth threshold TH4. By way of example, in the ($V_{R1}$, $V_{R2}$) detection circuit 214 shown in FIG. 5A, a comparator 570 compares the voltage $V_{R1}$ with the third threshold TH3 to generate an output 228 indicative of the comparison result, and a comparator 572 compares the voltage VR2 with the fourth threshold TH4 to generate an output 268 indicative of the comparison result. The control logic 226 receives the outputs 228 and 268. If the output 228 indicates that the voltage $V_{R1}$ on the first resistor $R_1$ is greater than the third threshold TH3, then the control logic 226 determines that an open circuit is present at the first terminal ISP. Similarly, if the output 268 indicates that the voltage $V_{R2}$ on the second resistor $R_2$ is greater than the fourth threshold TH4, then the control logic 226 determines that an open circuit is present at the second terminal ISN.

Figure 5B:
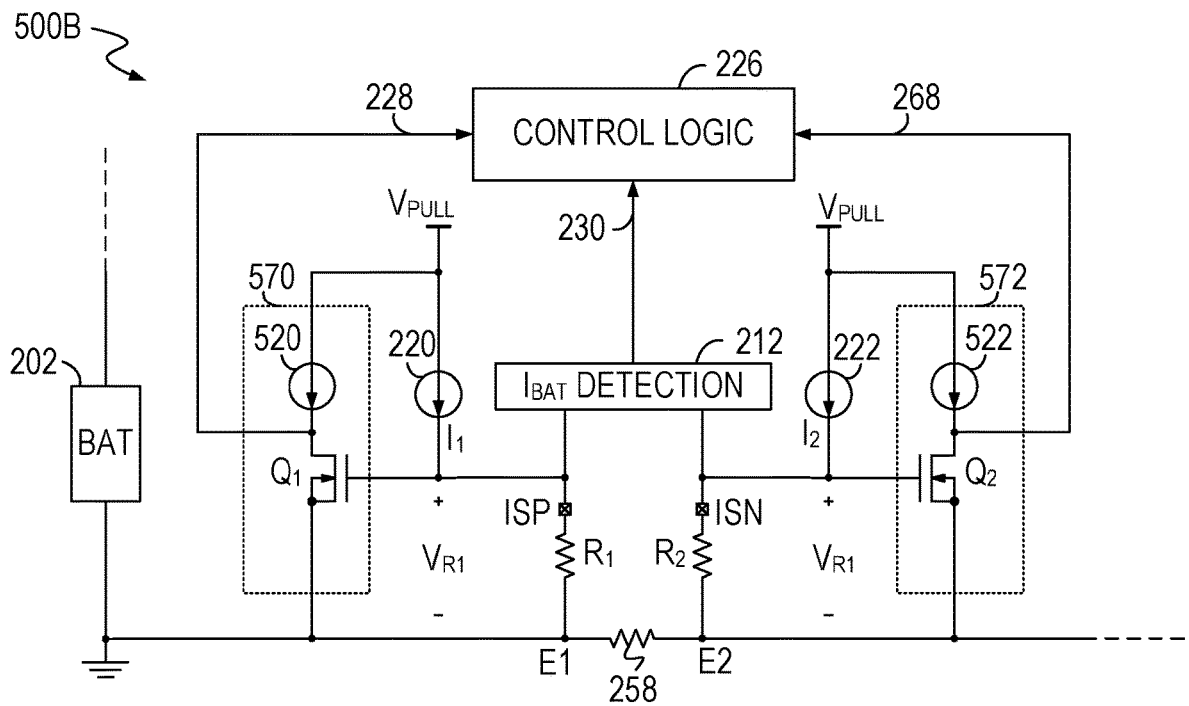
FIG. 5B illustrates a circuit diagram of an example of a detection circuit, in an embodiment of the present invention.

FIG. 5B illustrates a circuit diagram of an example of the abovementioned third detection circuit 500B, in an embodiment of the present invention. FIG. 5B is described in combination with FIG. 2A, FIG. 2B, FIG. 4 and FIG. 5A.

In the example of FIG. 5B, the comparator 570 includes a switch $Q_1$ (e.g., a MOSFET) and a current generating circuit 520. The first resistor $R_1$ can be coupled between the gate and source terminals of the switch $Q_1$ such that a voltage $V_{R1}$ on the first resistor $R_1$ controls a gate-source voltage of the switch $Q_1$. In an embodiment, the third threshold TH3 includes a turn-on threshold of the switch $Q_1$. If the voltage VR1 on the first resistor $R_1$ is less than the third threshold TH3, then the switch $Q_1$ i is turned off and the output 228 can be logic high. If the voltage $V_{R1}$ on the first resistor $R_1$ is greater than the third threshold TH3, then the switch $Q_1$ is turned on and the output 228 can be logic low. As a result, the logic level of the output 228 can indicate whether an open circuit is present at the first terminal ISP.

Similarly, the comparator 572 can include a switch $Q_2$ (e.g., a MOSFET) and a current generating circuit 522. The second resistor $R_2$ can be coupled between the gate and source terminals of the switch $Q_2$ such that a voltage $V_{R2}$ on the second resistor $R_2$ controls a gate-source voltage of the switch $Q_2$. In an embodiment, the fourth threshold TH4 includes a turn-on threshold of the switch $Q_2$. If the voltage $V_{R2}$ on the second resistor $R_2$ is less than the fourth threshold TH4, then the switch $Q_2$ is turned off and the output 268 can be logic high. If the voltage $V_{R2}$ on the second resistor $R_2$ is greater than the fourth threshold TH4, then the switch $Q_2$ is turned on and the output 268 can be logic low. As a result, the logic level of the output 268 can indicate whether an open circuit is present at the second terminal ISN.

Returning to FIG. 2B, in an embodiment, the abovementioned fourth detection circuit (e.g., including the temperature detection circuit 216 and the control logic circuit 226) detects whether a fault is present in the temperature sensor 260 (e.g., a thermistor $R_{THM}$) by comparing an indication voltage $V_{THM}$ on the temperature sensor 260 with a fifth threshold TH5 and a sixth threshold (which may also be referred to as indication voltage thresholds). The fifth threshold TH5 is less than the over-temperature threshold $V_{UT}$, and the sixth threshold TH6 is greater than the under-temperature threshold $V_{UT}$. More specifically, as mentioned above, in an embodiment, when the battery pack 200 is in a normal temperature condition, the indication voltage $V_{THM}$ is greater than the over-temperature threshold $V_{OT}$ and less than the under-temperature threshold $V_{UT}$($V_{UT}$>$V_{OT}$). If a short circuit is present in the thermistor $R_{THM}$, then the indication voltage $V_{THM}$ can be dragged down by the ground, e.g., zero volts, to less than the over-temperature threshold $V_{OT}$. Thus, if the fourth detection circuit detects that the indication voltage $V_{THM}$ is less than the fifth threshold TH5 (e.g., TH5<$V_{OT}$) for a specified time interval, then the fourth detection circuit determines that a short circuit is present in the thermistor $R_{THM}$. On the other hand, if an open circuit is present in the thermistor $R_{THM}$, then the indication voltage $V_{THM}$ can be pulled up by an internal voltage to greater than the under-temperature threshold $V_{UT}$. Thus, if the fourth detection circuit detects that the indication voltage $V_{THM}$ is greater than a sixth threshold TH6 (e.g., TH6>$V_{UT}$) for a specified time interval, then the fourth detection circuit determines that an open circuit is present in the thermistor $R_{THM}$.

Figure 6:
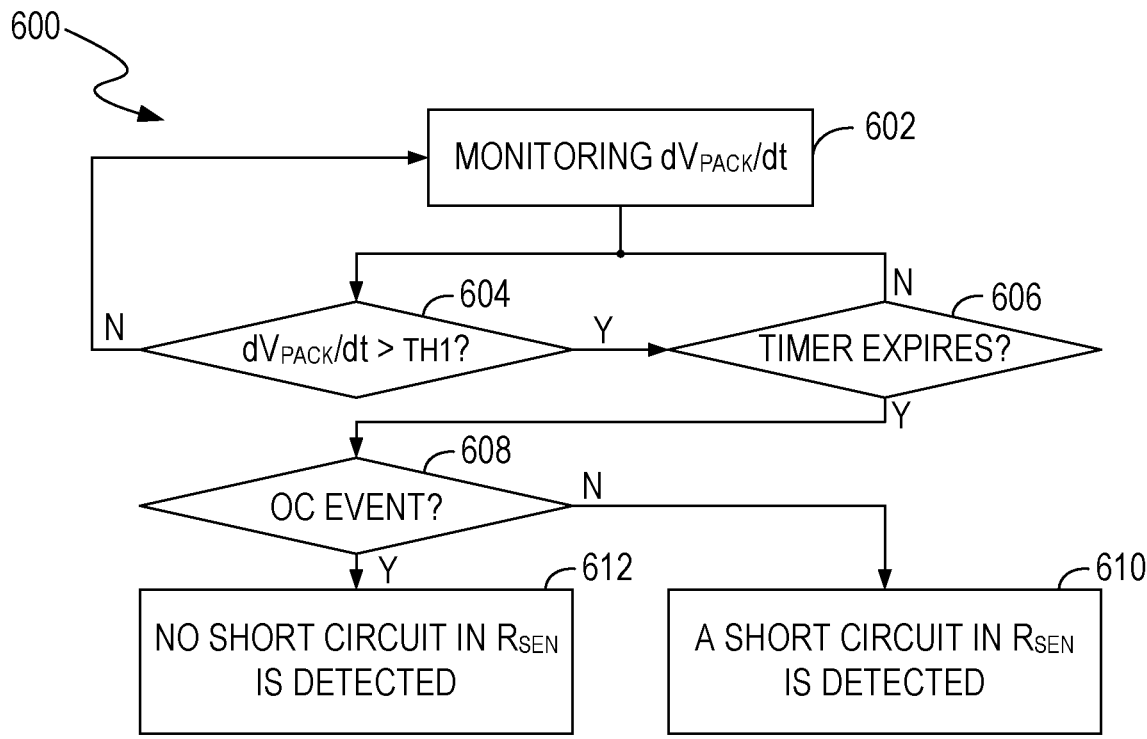
FIG. 6 illustrates an example of a method for detecting whether a short circuit is present in a current sensor, in an embodiment of the present invention.

FIG. 6 illustrates a flowchart 600 of an example of a method for detecting whether a short circuit is present in the current sensor 258, in an embodiment of the present invention. FIG. 6 is described in combination with FIG. 2A, FIG. 2B, FIG. 3 and FIG. 4. Although specific steps are disclosed in FIG. 6, such steps are examples for illustrative purposes. That is, embodiments according to the present invention are well-suited to performing various other steps or variations of the steps recited in FIG. 6. In an embodiment, operations in the flowchart 600 can be performed by the abovementioned first detection circuit (e.g., including the rate-of-change detection circuit 208 and the control logic circuit 226).

By way of example, at step 602, the rate-of-change detection circuit 208 monitors a rate of change $dV_{PACK}/dt$ of a terminal voltage $V_{PACK}$ at the positive terminal PACK+ of the battery pack 200, and generates a signal 238 indicative of the rate of change $dV_{PACK}/dt$.

At step 604, the control logic circuit 226 compares the rate of change $dV_{PACK}/dt$ with the first threshold TH1. If the rate of change $dV_{PACK}/dt$ is greater than the first threshold TH1, then the flowchart 600 goes to step 606; otherwise, it returns to step 602.

At step 606, if the control logic circuit 226 detects that the rate of change $dV_{PACK}/dt$ is greater than the first threshold TH1 for a predetermined time interval $\Delta t_{PRE}$, then the flowchart 600 goes to step 608; otherwise, it goes to step 604.

At step 608, the control logic circuit 226 receives a comparison result 230 from the battery-current detection circuit 212 and determines whether an OC condition is present in the battery pack 200. If the control logic circuit 226 determines that an OC condition is present in the battery pack 200, then the flowchart 600 goes to step 612; otherwise, it goes to step 610.

At step 612, the control logic circuit 226 determines that no short circuit is present in the current sensor 260.

At step 610, the control logic circuit 226 determines that a short circuit is present in the current sensor 260.

Figure 7:
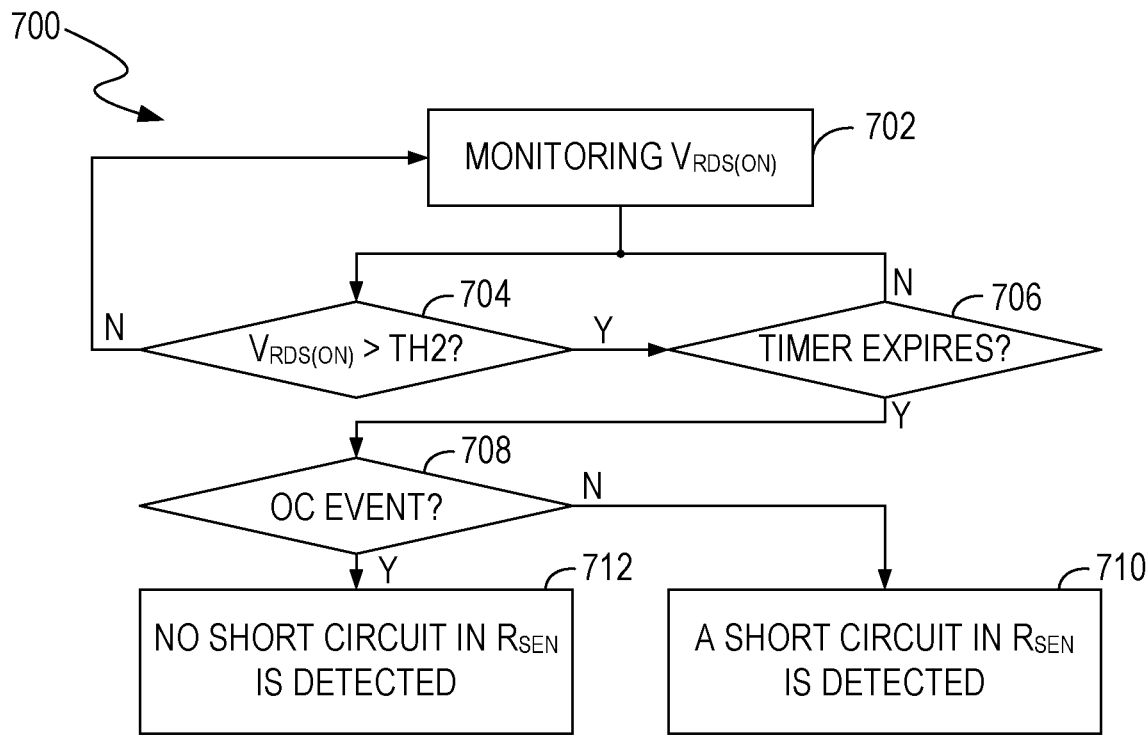
FIG. 7 illustrates an example of a method for detecting whether a short circuit is present in a current sensor, in an embodiment of the present invention.

FIG. 7 illustrates a flowchart 700 of an example of a method for detecting whether a short circuit is present in the current sensor 258, in an embodiment of the present invention. FIG. 7 is described in combination with FIG. 2A, FIG. 2B and FIG. 4. Although specific steps are disclosed in FIG. 7, such steps are examples for illustrative purposes. That is, embodiments according to the present invention are well-suited to performing various other steps or variations of the steps recited in FIG. 7. In an embodiment, operations in the flowchart 700 can be performed by the abovementioned second detection circuit (e.g., including the $V_{RDS(ON)}$ detection circuit 218 and the control logic circuit 226).

More specifically, at step 702, the $V_{RDS(ON)}$ detection circuit 218 monitors a sense voltage $V_{RDS(OS)}$ across the $R_{DS(ON)}$ resistance of the discharge switch $Q_{DSG}$ and generates a signal 236 (FIG. 2B) indicative of the sense voltage $V_{RDS(ON)}$.

At step 704, the control logic circuit 226 receives the signal 236 to determine whether the sense voltage $V_{RDS(OS)}$ is greater than the second threshold TH2. If the sense voltage $V_{RDS(ON)}$ is greater than the second threshold TH2, then the flowchart 700 goes to step 706; otherwise, it returns to step 702.

At step 706, if the control logic circuit 226 detects that the sense voltage $V_{RDS(ON)}$ is greater than the second threshold TH2 for a preset time interval, then the flowchart 700 goes to step 708; otherwise, it goes to step 704.

At step 708, the control logic circuit 226 receives a comparison result 230 from the battery-current detection circuit 212 and determines whether an OC condition is present in the battery pack 200. If the control logic circuit 226 determines that an OC condition is present in the battery pack 200, then the flowchart 700 goes to step 712; otherwise, it goes to step 710.

At step 712, the control logic circuit 226 determines that no short circuit is present in the current sensor 260.

At step 710, the control logic circuit 226 determines that a short circuit is present in the current sensor 260.

In an embodiment, the BMS 204 can detect whether a short circuit is present in the current sensor 258 by performing the method in FIG. 6. In another embodiment, the BMS 204 can detect whether a short circuit is present in the current sensor 258 by performing the method in FIG. 6 in combination with the method in FIG. 7. For example, if the control logic circuit 226 detects that the rate of change $dV_{pack}/dt$ is greater than the first threshold TH1 for a predetermined time interval $\Delta t_{PRE}$ and the sense voltage $V_{RDS(OS)}$ is greater than the second threshold TH2 for a preset time interval, and the control logic circuit 226 detects that the battery pack 200 is in a normal condition, then the control logic circuit 226 determines that a short circuit is present in the current sensor 258.

Figure 8:
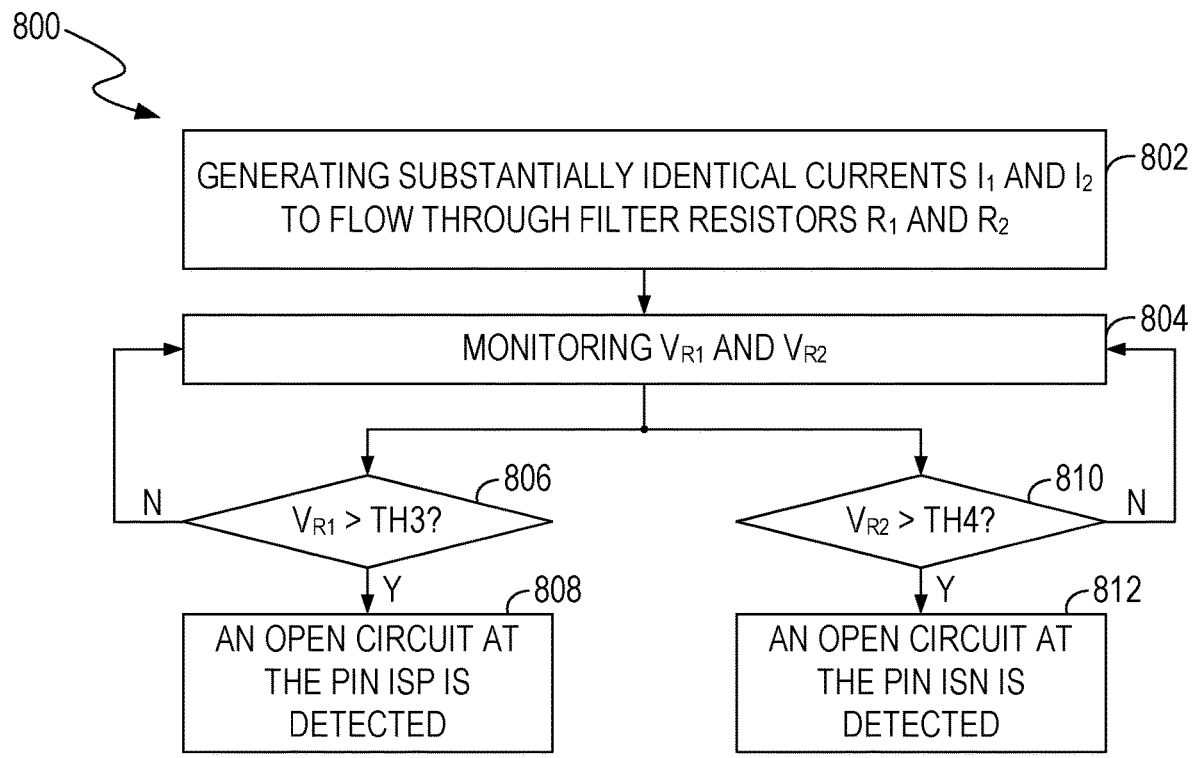
FIG. 8 illustrates an example of a method for detecting whether an open circuit is present at a sensing pin coupled to a current sensor, in an embodiment of the present invention.

FIG. 8 illustrates a flowchart 800 of an example of a method for detecting whether an open circuit is present at a sensing pin ISP or ISN coupled to the current sensor 258, in an embodiment of the present invention. FIG. 8 is described in combination with FIG. 2A, FIG. 2B, FIG. 4, FIG. 5A and FIG. 5B. Although specific steps are disclosed in FIG. 8, such steps are examples for illustrative purposes. That is, embodiments according to the present invention are well-suited to performing various other steps or variations of the steps recited in FIG. 8. In an embodiment, operations in the flowchart 800 can be performed by the abovementioned third detection circuit (e.g., including the ($V_{R1}$, $V_{R2}$) detection circuit 214, the current generating circuits 220 and 222, and the control logic circuit 226).

More specifically, at step 802, the current generating circuits 220 and 222 generate substantially identical currents $I_1$ and $I_2$ to flow through the filter resistors $R_1$ and $R_2$, respectively.

At step 804, the ($V_{R1}$, $V_{R2}$) detection circuit 214 monitors a voltage $V_{R1}$ on the first filter resistor $R_1$ and a voltage $V_{R2}$ on the second filter resistor $R_2$.

For example, at step 806, the comparator 570 (e.g., including the current generating circuit 520 and the switch $Q_1$) compares the voltage $V_{R1}$ on the first filter resistor $R_1$ with the third threshold TH3 to generate an output 228. If the output 228 indicates that the voltage $V_{R1}$ on the first filter resistor $R_1$ is greater than the third threshold TH3, then the flowchart 800 goes to step 808; otherwise, it goes to step 804.

At step 808, the control logic circuit 226 determines that an open circuit is present at the first terminal ISP.

For another example, at step 810, the comparator 572 (e.g., including the current generating circuit 522 and the switch $Q_2$) compares the voltage $V_{R2}$ on the second filter resistor $R_2$ with the fourth threshold TH4 to generate an output 268. If the output 268 indicates that the voltage $V_{R2}$ on the second filter resistor $R_2$ is greater than the fourth threshold TH4, then the flowchart 800 goes to step 812; otherwise, it goes to step 804.

At step 812, the control logic circuit 226 determines that an open circuit is present at the second terminal ISN.

Figure 9:
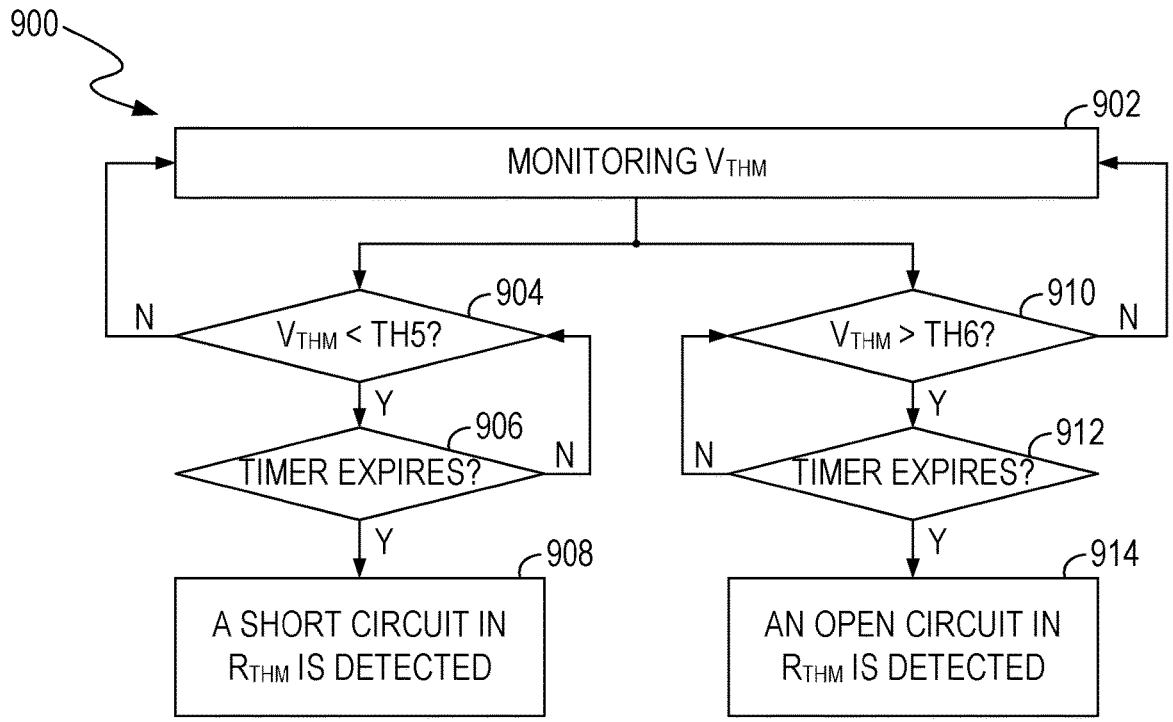
FIG. 9 illustrates an example of a method for detecting a fault in a temperature sensor, in an embodiment of the present invention.

FIG. 9 illustrates a flowchart 900 of an example of a method for detecting a fault in the temperature sensor 260, in an embodiment of the present invention. FIG. 9 is described in combination with FIG. 2A and FIG. 2B. Although specific steps are disclosed in FIG. 9, such steps are examples for illustrative purposes. That is, embodiments according to the present invention are well-suited to performing various other steps or variations of the steps recited in FIG. 9. In an embodiment, operations in the flowchart 900 can be performed by the abovementioned fourth detection circuit (e.g., including the detection circuit 216 and the control logic circuit 226).

More specifically, at step 902, the temperature detection circuit 216 monitors an indication voltage $V_{THM}$ from the temperature sensor 260 to generate a signal 232 indicative of the indication voltage $V_{THM}$, e.g., indicative of the temperature of the battery pack 200.

At step 904, the control logic circuit 226 obtains information for the indication voltage $V_{THM}$ from the signal 232, and compares the indication voltage $V_{THM}$ with the fifth threshold TH5. If the indication voltage $V_{THM}$ is less than the fifth threshold TH5, then the flowchart 900 goes to step 906; otherwise, it returns to step 902.

At step 906, if the control logic circuit 226 detects that the indication voltage $V_{THM}$ is less than the fifth threshold TH5 for a specified time interval, then the flowchart 900 goes to step 908; otherwise, it goes to step 904.

At step 908, the control logic circuit 226 determines that a short circuit is present in the temperature sensor 260.

At step 910, the control logic circuit 226 obtains information for the indication voltage $V_{THM}$ from the signal 232, and compares the indication voltage $V_{THM}$ with the sixth threshold TH6. If the indication voltage $V_{THM}$ is greater than the sixth threshold TH6, then the flowchart 900 goes to step 912; otherwise, it returns to step 902.

At step 912, if the control logic circuit 226 detects that the indication voltage VTHM is greater than the sixth threshold TH6 for a specified time interval, then the flowchart 900 goes to step 914; otherwise, it goes to step 910.

At step 914, the control logic circuit 226 determines that an open circuit is present in the temperature sensor 260.

Although FIG. 9 shows that steps 904 and 910 are performed in parallel, the invention is not so limited. In another embodiment, the BMS 204 can perform step 910 before or after performing step 904. For example, at step 904, if the indication voltage $V_{THM}$ is not less than the fifth threshold TH5, then the flowchart goes to step 910; otherwise, it goes to step 906. For another example, at step 910, if the indication voltage $V_{THM}$ is not greater than the sixth threshold TH6, then the flowchart goes to step 904; otherwise, it goes to step 912.

Figure 10:
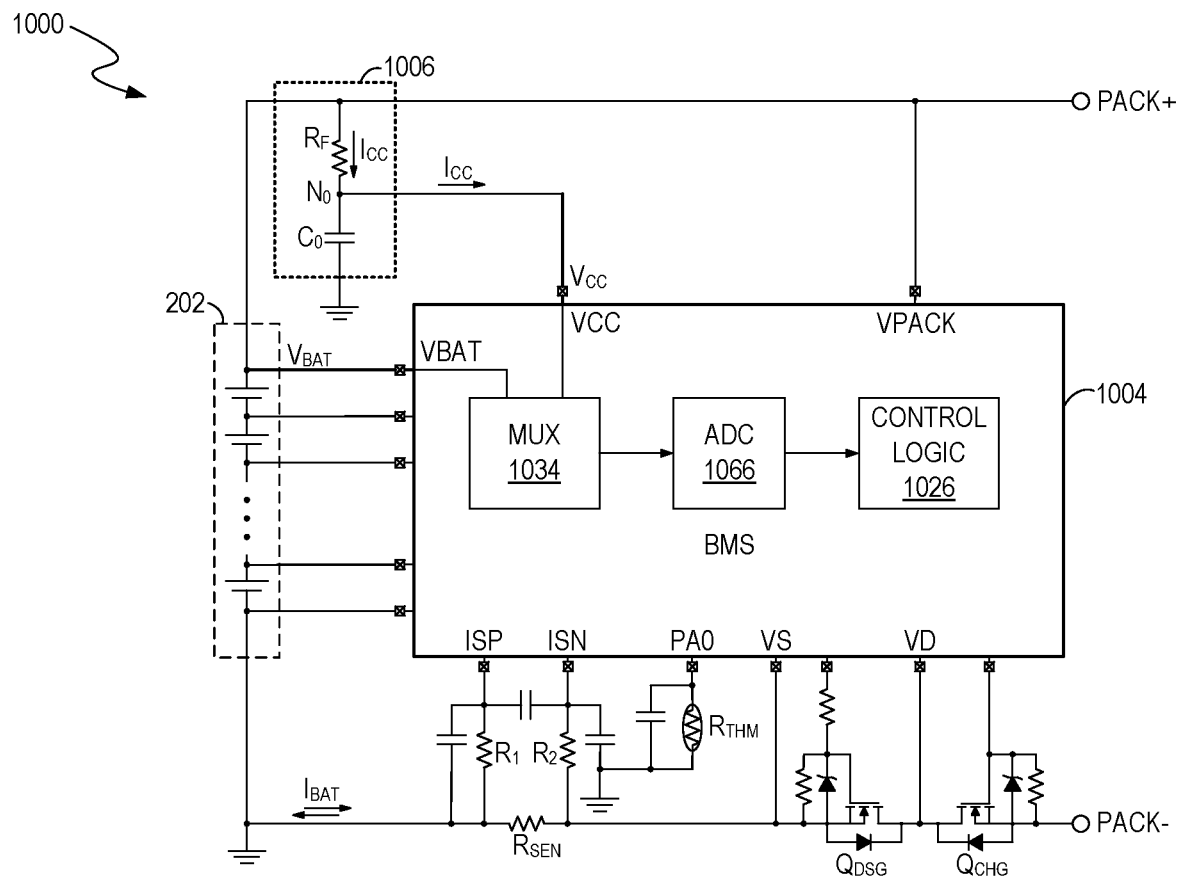
FIG. 10 illustrates a circuit diagram of an example of a battery pack, in an embodiment of the present invention.

FIG. 10 illustrates a circuit diagram of an example of a battery pack 1000, in an embodiment of the present invention. FIG. 10 is described in combination with FIG. 2A and FIG. 2B. As shown in FIG. 10, the battery pack 1000 includes a low-pass filter 1006 and a BMS 1004. The BMS 1004 can be powered by the battery cells 202 through the low-pass filter 1006. In an embodiment, the BMS 1004 can also include circuits similar to the status detection circuit 262' and the fault detection circuit 264' in FIG. 2B.

As shown in FIG. 10, the low-pass filter 1006 includes a resistive component RF, e.g., a filter resistor, coupled between a positive terminal of the battery cells 202 and a connection node $N_0$, and a filter capacitor $C_0$ coupled between the connection node $N_0$ and ground. In an embodiment, the BMS 1004 can perform the status detection functions described above in relation to FIG. 2A and FIG. 2B. The BMS 1004 can also, but not necessarily, perform the fault detection functions described above in relation to FIG. 2A and FIG. 2B. Additionally, the BMS 1004 can include a fifth detection circuit (e.g., including a multiplexer circuit 1034, an ADC 1066, and a control logic circuit 1026) that receives a battery voltage $V_{BAT}$ at the positive terminal of the battery cells 202, receives a supply voltage $V_{CC}$ from the battery cells 202 through the connection node $No_0$, and detects whether a fault is present in the BMS 1004 according to the difference between the battery voltage $V_{BAT}$ and the supply voltage $V_{CC}$.

More specifically, in an embodiment, the BMS 1004 is powered by a supply current $I_{CC}$ through the power supply pin VCC of the BMS 1004. Because the supply current $I_{CC}$ flows through the resistive component RF, a voltage $V_{BAT}$-$V_{CC}$ across the resistive component $R_F$ represents, e.g., is linearly proportional to, the supply current $I_{CC}$. Thus, the supply current $I_{CC}$ that powers the BMS 1004 can be estimated by: $I_{CC}=(V_{BAT}-V_{CC})/R_F$. In an embodiment, the BMS 1004 has an operating range for the supply current $I_{CC}$. If the supply current $I_{CC}$ exceeds the maximum current of the operating range, it can indicate that a fault, e.g., a short circuit, is present in one or more components powered by a power regulator, e.g., a voltage regulator, in the BMS 1004. Thus, in an embodiment, if the difference between the battery voltage $V_{BAT}$ and the supply voltage $V_{CC}$ is greater than a seventh threshold TH7 (which may also be referred to as a voltage difference threshold), e.g., indicating that the supply current $I_{CC}$ is greater than a safe current threshold and indicating that power consumed by the BMS 1004 exceeds a safe threshold, then the fifth detection circuit can determine that a fault, e.g., a short circuit, is present in the BMS 1004. Accordingly, the BMS 1004 can stop charging/discharging the battery pack 1004.

In an embodiment, the seventh threshold TH7 represents a safe current threshold that is greater than the maximum current level of the operating range for the supply current $I_{CC}$.

In summary, embodiments according to the present invention provide solutions to detect faults, e.g., including short circuit and/or open circuit, in battery packs. For example, if a BMS in the battery pack detects that a rate of change $dV_{PACK}/dt$ at a positive terminal PACK+ of the battery pack is greater than a first threshold for a predetermined time interval, and the BMS does not detect an OC condition, then the BMS can determine that a short circuit is present in a battery current sensor in the battery pack. For another example, if the BMS detects that an $R_{DS(ON)}$ voltage of a discharge switch of the battery pack is greater than a second threshold for a preset time interval, and the BMS does not detect an OC condition, then the BMS can determine that a short circuit is present in the battery current sensor. For yet another example, the BMS can generate identical currents to flow through identical filter resistors coupled between the current sensing pins ISP and ISN and the battery current sensor, such that the voltages at the sensing pins ISP and ISN not only can represent the battery current when the pins ISP and ISN are well-connected to the current sensor, but also can represent an open circuit at the pin ISP or ISN when the pin ISP or ISN is not well-connected to the current sensor. For yet another example, the BMS can compare an indication voltage on a temperature sensor with a fifth threshold that represents a short circuit in the temperature sensor, and compare the indication voltage with a sixth threshold that represents an open circuit in the temperature sensor. The comparison result can indicate whether a short circuit or an open circuit is present in the temperature sensor. For yet another example, the BMS can detect whether power consumed by the BMS exceeds a safe threshold by comparing a difference between a battery voltage and a supply voltage of the BMS with a seventh threshold. If it is detected that the power consumed by the BMS exceeds the safe threshold, then it can be determined that a short circuit is present in the components powered by the BMS.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

I claim:

1. A battery management system comprising:
a plurality of sensors that sense statuses of a battery pack comprising a battery cell coupled to a positive terminal of said battery pack through a printed circuit board trace, wherein said sensors comprise a current sensor that senses a battery current flowing from said battery cell to said positive terminal of said battery pack through said printed circuit board trace;
status detection circuitry, coupled to said sensors, that detects whether said battery pack is in a normal condition based on said statuses to generate a detection result; and
fault detection circuitry, coupled to said sensors, that detects whether a fault is present in said battery pack,
wherein said fault detection circuitry comprises a first detection circuit that monitors a rate of decrease of a voltage at said positive terminal of said battery pack, and detects whether a fault is present in said current sensor based on a result of a comparison between said rate of decrease and a rate of change threshold and also based on said detection result, and
wherein if said rate of decrease is greater than said rate of change threshold for a predetermined time interval, and if said detection result indicates that said battery current is in said normal condition, then said status detection circuitry determines that a fault is present in said current sensor.

2. The battery management system of claim 1, wherein said fault in said current sensor comprises a short circuit in said current sensor.

3. The battery management system of claim 1, wherein said battery pack comprises a discharge switch that said battery current flows through, and
wherein said fault detection circuitry further comprises a second detection circuit that monitors a sense voltage across said discharge switch, and detects whether a fault is present in said current sensor based on a result of a comparison between said sense voltage and a sense voltage threshold, and also based on said detection result of said status detection circuitry.

4. The battery management system of claim 3, wherein if said sense voltage is greater than said sense voltage threshold for a preset time interval, and if said status detection circuitry detects that said battery current is in said normal condition, then a short circuit in said current sensor is indicated.

5. The battery management system of claim 1, wherein said battery pack comprises a first resistor coupled between a first end of said current sensor and a first terminal of said status detection circuitry, and also comprises a second resistor coupled between a second end of said current sensor and a second terminal of said status detection circuitry,
wherein said fault detection circuitry further comprises a detection circuit that generates a first current through said first resistor from said first terminal to said first end, generates a second current through said second resistor from said second terminal to said second end, and detects whether a fault is present at said first terminal by comparing a voltage on said first resistor with a first voltage threshold and detects whether a fault is present at said second terminal by comparing a voltage on said second resistor with a second voltage threshold.

6. The battery management system of claim 5, wherein said first and second resistors have substantially the same resistance, and wherein said first and second currents have substantially the same current level.

7. The battery management system of claim 5, wherein if said voltage on said first resistor is greater than said first voltage threshold, then an open circuit at said first terminal is indicated, and wherein if said voltage on said second resistor is greater than said second voltage threshold, then an open circuit at said second terminal is indicated.

8. The battery management system of claim 1, wherein said sensors further comprise a thermistor, coupled to said fault detection circuitry, that generates an indication voltage indicative of temperature in said battery pack, and wherein if said fault detection circuitry detects that said indication voltage is less than an indication voltage threshold for a specified time interval, then a short circuit in said thermistor is indicated.

9. The battery management system of claim 1, wherein said sensors further comprise a thermistor, coupled to said fault detection circuitry, that generates an indication voltage indicative of temperature in said battery pack, and wherein if said fault detection circuitry detects that said indication voltage is greater than said indication voltage threshold for a specified time interval, then an open circuit in said thermistor is indicated.

10. The battery management system of claim 1, wherein said fault detection circuitry further comprises a second detection circuit that receives a battery voltage at a positive terminal of said battery cell in said battery pack, receives a supply voltage for said battery management system at a connection node, and detects whether a fault is present in said battery management system according to a difference between said battery voltage and said supply voltage, wherein said battery pack comprises a resistive component coupled between said positive terminal of said battery cell and said connection node, and wherein a current flowing from said positive terminal of said battery cell to said connection node through said resistive component powers said battery management system.

11. The battery management system of claim 10, wherein if said difference between said battery voltage and said supply voltage is greater than a voltage difference threshold, then a fault in said battery management system is indicated.

12. The battery management system of claim 11, wherein said fault in said battery management system comprises a short circuit in said battery management system.

13. A battery pack comprising:
 a plurality of battery cells coupled to a positive terminal of said battery pack through a printed circuit board trace;
 a plurality of sensors that sense statuses of said battery cells, said sensors comprising a current sensor that senses a battery current flowing from said battery cells to said positive terminal of said battery pack through said printed circuit board trace; and
 a battery management system, coupled to said battery cells and said sensors, that detects whether said battery pack is in a normal condition based on said statuses to generate a detection result, and detects whether a fault is present in said battery pack,
 wherein said battery management system comprises a first detection circuit that monitors a rate of decrease of a voltage at said positive terminal of said battery pack, and detects whether a fault is present in said current sensor based on a result of a comparison between said rate of decrease and a rate of change threshold and also based on said detection result, and
 wherein if said rate of decrease is greater than said rate of change threshold for a predetermined time interval, and if said detection result indicates that said battery current is in said normal condition, then said battery management system determines that a fault is present in said current sensor.

14. The battery pack of claim 13, wherein said fault in said current sensor comprises a short circuit in said current sensor.

15. The battery pack of claim 13, wherein said battery pack comprises a discharge switch that said battery current flows through, and
 wherein said battery management system further comprises a second detection circuit that monitors a sense voltage across said discharge switch, and detects whether a fault is present in said current sensor based on a result of a comparison between said sense voltage and a sense voltage threshold, and also based on said detection result.

16. The battery pack of claim 13, wherein said battery pack comprises a first resistor coupled between a first end of said current sensor and a first terminal of said battery management system, and also comprises a second resistor coupled between a second end of said current sensor and a second terminal of said battery management system,
 wherein said battery management system further comprises a second detection circuit that generates a first current through said first resistor from said first terminal to said first end, generates a second current through said second resistor from said second terminal to said second end, and detects whether a fault is present at said first terminal by comparing a voltage on said first resistor with a first voltage threshold and detects whether a fault is present at said second terminal by comparing a voltage on said second resistor with a second voltage threshold.

17. The battery pack of claim 13, wherein said sensors comprise a temperature sensor that generates an indication voltage indicative of temperature in said battery pack, and wherein said battery management system further comprises a second detection circuit that detects whether a fault is present in said temperature sensor by comparing said indication voltage with an indication voltage threshold.

18. The battery pack of claim 13, wherein said battery management system further comprises a second detection circuit that receives a battery voltage at a positive terminal of said battery cells, receives a supply voltage for said battery management system at a connection node, and detects whether a fault is present in said battery management system according to a difference between said battery voltage and said supply voltage, wherein said battery pack comprises a resistive component coupled between said positive terminal of said battery cell and said connection node, and wherein a current flowing from said positive terminal of said battery cells to said connection node through said resistive component powers said battery management system.

19. A method for detecting a fault in a battery pack, said method comprising:
 sensing, using a current sensor, a battery current flowing from a battery cell in said battery pack to a positive terminal of said battery pack through a printed circuit board trace between said battery cell and said positive terminal of said battery pack;
 detecting whether said battery pack is in a normal condition based on statuses of said battery pack to generate a detection result;
 monitoring a rate of decrease of a voltage at said positive terminal of said battery pack;
 comparing said rate of decrease with a rate of change threshold; and
 determining whether a fault is present in said battery current sensor, wherein said fault is present if said rate of decrease is greater than said rate of change threshold for a predetermined time interval, and if said detection result indicates that said battery current is in said normal condition.

20. The method of claim 19, wherein said fault in said current sensor comprises a short circuit in said current sensor.

* * * * *